(12) United States Patent
Choi

(10) Patent No.: US 7,324,390 B2
(45) Date of Patent: Jan. 29, 2008

(54) LOW VOLTAGE OPERATION DRAM CONTROL CIRCUITS

(75) Inventor: Myung Chan Choi, San Jose, CA (US)

(73) Assignee: Zmos Technology, Inc., San Jose, CA (US)

( * ) Notice: Subject to any disclaimer, the term of this patent is extended or adjusted under 35 U.S.C. 154(b) by 0 days.

(21) Appl. No.: 11/449,170

(22) Filed: Jun. 7, 2006

(65) Prior Publication Data

US 2006/0227593 A1    Oct. 12, 2006

Related U.S. Application Data

(62) Division of application No. 10/934,312, filed on Sep. 3, 2004, now Pat. No. 7,082,048.

(60) Provisional application No. 60/500,662, filed on Sep. 5, 2003.

(51) Int. Cl.
*G11C 7/00* (2006.01)

(52) U.S. Cl. .................. 365/189.11; 365/191

(58) Field of Classification Search ........... 365/189.11, 365/191
See application file for complete search history.

(56) References Cited

U.S. PATENT DOCUMENTS

| | | | |
|---|---|---|---|
| 5,434,822 A * | 7/1995 | Deleganes et al. | 365/203 |
| 5,557,580 A | 9/1996 | Numaga et al. | |
| 5,625,597 A | 4/1997 | Hirose | |
| 5,640,350 A | 6/1997 | Iga | |
| 5,970,007 A | 10/1999 | Shiratake | |
| 6,046,956 A | 4/2000 | Yabe | |
| 6,195,305 B1 | 2/2001 | Fujisawa et al. | |
| 6,642,098 B2 | 11/2003 | Leung et al. | |
| 6,650,590 B2 * | 11/2003 | Inaba et al. | 365/226 |
| 6,804,153 B2 | 10/2004 | Yoshizawa et al. | |
| 2002/0024876 A1 | 2/2002 | Kohno | |
| 2006/0062061 A1 * | 3/2006 | Suh et al. | 365/203 |

FOREIGN PATENT DOCUMENTS

| EP | 1255254 A2 | 11/2006 |
|---|---|---|
| JP | 08181287 A | 7/1996 |

* cited by examiner

*Primary Examiner*—Michael Tran
(74) *Attorney, Agent, or Firm*—John P. O'Banion (57) ABSTRACT

Circuits and methods are described for reducing leakage current and speeding access within dynamic random access memory circuit devices. A number of beneficial aspects are described. A circuit is described for an enhanced sense amplifier utilizing complementary drain transistors coupled to the sense or restore signals and driven by gate voltages which extend outside of the voltage range between $V_{SS}$ and $V_{DD}$. The drain transistors are self reverse-biased in a standby mode. A method is also described for reducing leaking in non-complementary sense amplifiers by modifying the sense and restore gate voltages. Another aspect is a new negative word line method utilizing stacked pull-down transistors and a multi-step control circuit. In addition a level shifter scheme is described for preventing unwanted current flow between voltage sources while discharging control signal PX.

25 Claims, 11 Drawing Sheets

LOW VOLTAGE OPERATION DRAM CONTROL CIRCUITS

CROSS-REFERENCE TO RELATED APPLICATIONS

This application is a divisional of U.S. application Ser. No. 10/934,312, now U.S. Pat. No. 7,082,048 filed Sep. 3, 2004, incorporated herein by reference in its entirety, which claims priority from U.S. provisional application Ser. No. 60/500,662, filed on Sep. 5, 2003, which is incorporated herein by reference. Priority is claimed to each of the foregoing applications.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C. F. R. § 1.14.

BACKGROUND OF THE INVENTION

1. Field of the Invention

This invention pertains generally to semiconductor memory, and more particularly to control circuits within dynamic random access memories.

2. Description of Related Art

Dynamic Random Access Memory (DRAM) has been used as a main memory for servers, personal computers, and a wide range of other electronic devices. During DRAM operation a core sensing operation that reads data from the memory cell is key to determining DRAM access speed and minimum operating voltage. Lowering the operating voltage is very important for current and future applications to achieve power savings and device scalability. However, operation at reduced voltages inevitably causes performance (speed) degradation of the transistor due to the smaller gate-to-source voltage ($V_{GS}$) available. Currently, the only way to mitigate such performance degradation is to scale down the threshold voltage of the transistor. However, the scaling of the threshold voltage also causes an exponential increase in the sub-threshold leakage current flowing through the transistor even though the transistor is in an off state.

This sub-threshold leakage current can constitute a substantial portion of the overall power consumption, in particular power consumption in the standby mode. Typically, the maximum standby current in the self-refresh mode of the DRAM is about 100 μA. When the transistor with the scaled threshold voltage (i.e., low $V_t$ transistor) is utilized, a typical sub-threshold leakage current for a 0.13 μm technology is about 10 nA and can reach about 1 μA when subjected to an elevated temperature such as 125° C. Typically, the sense amplifier is shared by two bit lines in different blocks and 256 cells are connected to the bit line in each block (256 cells per bit line). Therefore, for a 1 Gigabit DRAM having 1024×1024×1024 cells, there are 2×1024×1024 sense amplifiers. If the sub-threshold leakage current per sense amplifier is 1 nA ($10^{-9}$ A), the total sub-threshold leakage current is 2×1024×1024×$10^{-9}$=2 mA, which is much larger than the maximum allowable standby current in the self-refresh mode.

Figure 1:
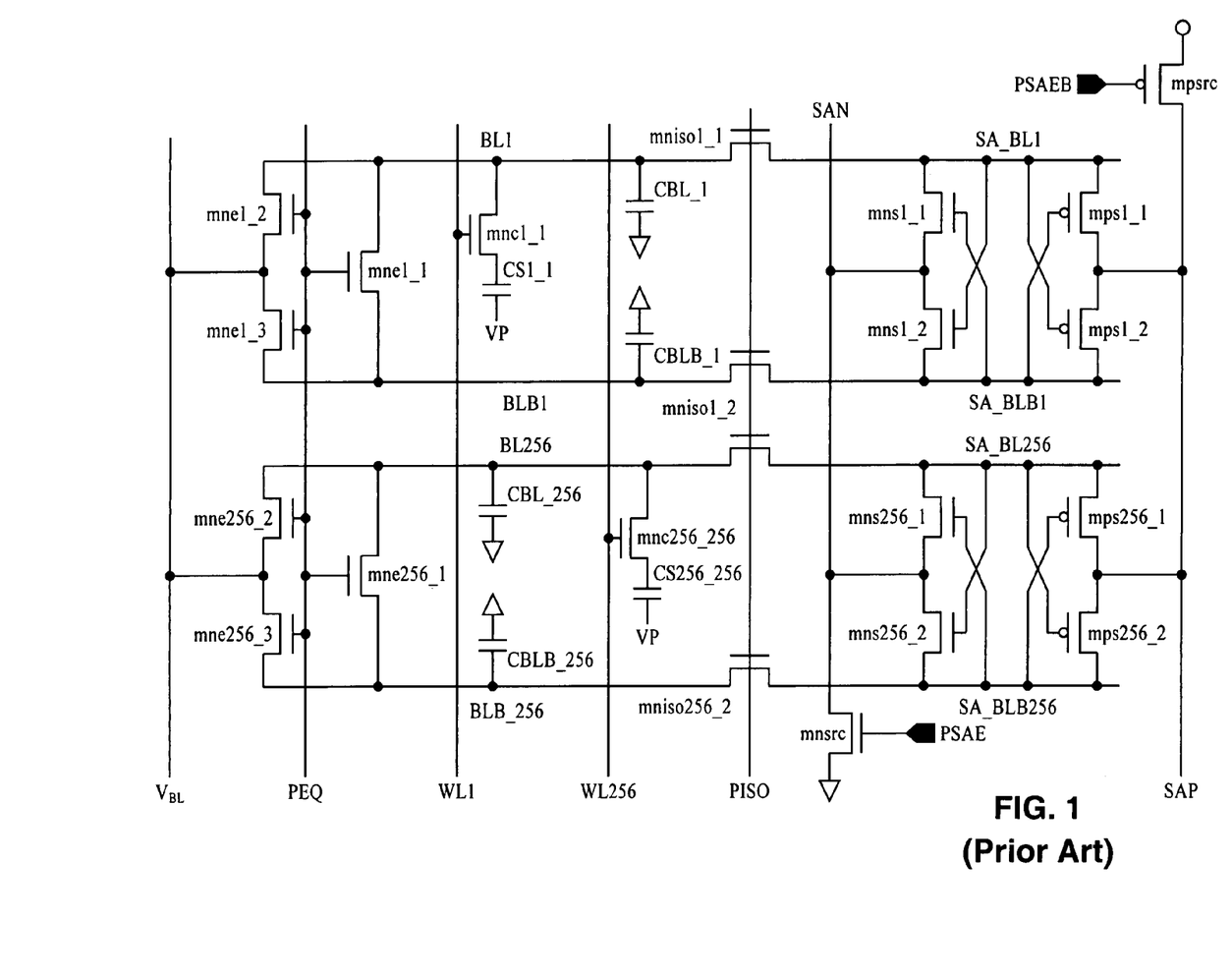
FIG. 1 is a schematic of a conventional DRAM core structure.
Figure 2:
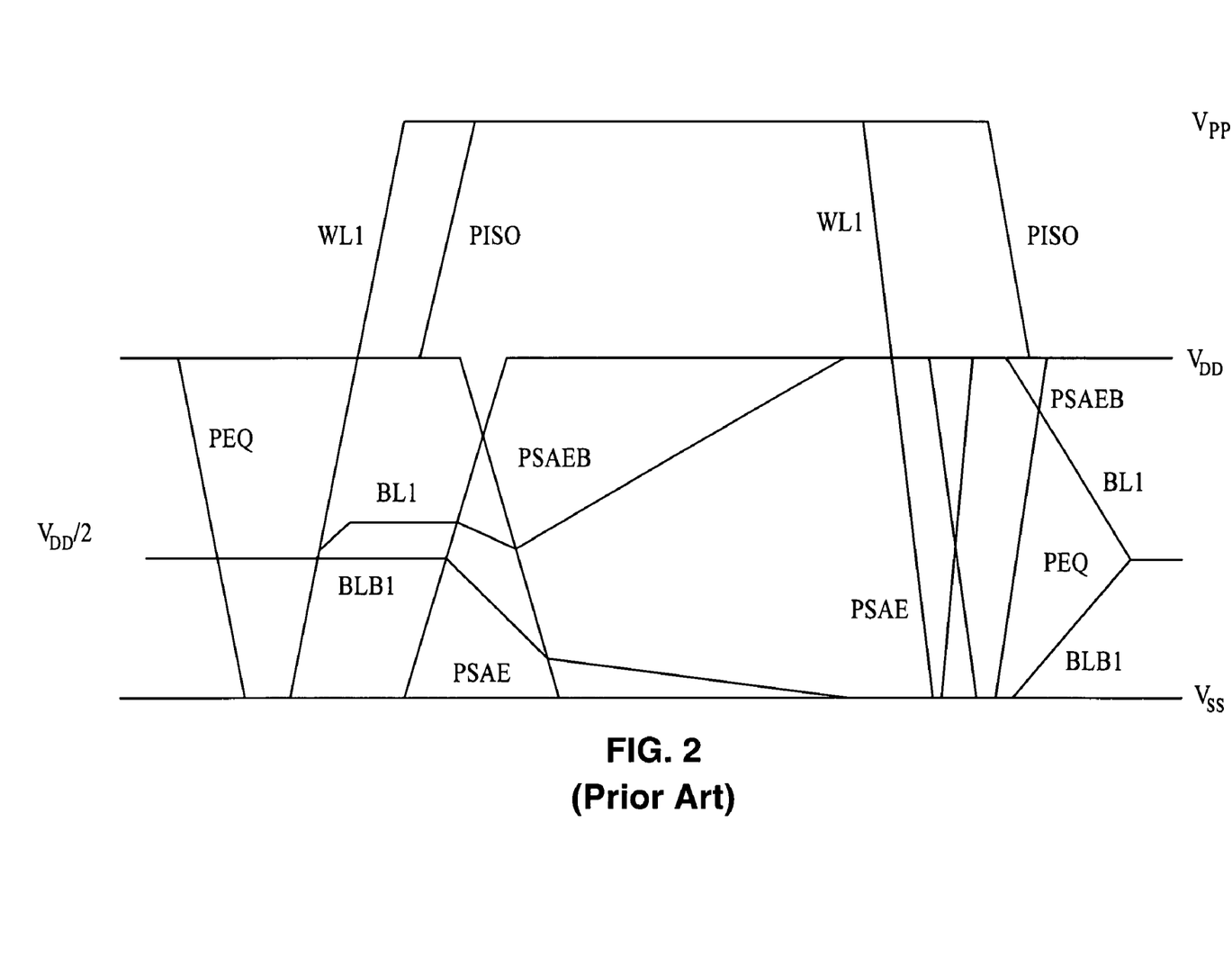
FIG. 2 is a timing diagram for the conventional DRAM core structure of FIG. 1.

FIG. 1 and FIG. 2 depict a conventional DRAM core structure and its associated timing diagram. Typically, the DRAM device is implemented with a folded-bit line structure as shown in the figure. The memory array consists of plural word lines and bit lines. In FIG. 1, there are 256 word lines and 256 bit line pairs. Since there is one cell per bit line pair in the folded-bit line architecture, the memory array size is 256×256=64 k bit. The bit line sense amplifier is placed per bit line pair, thus there are 256 sense amplifiers in this memory array. The typical structure of sense amplifier used in DRAM is a CMOS latch sense amplifier, such as comprising transistors mns1_1, mns1_2, mps1_1 and mps1_2 with source nodes comprising source node sensing (SAN) and source node restoring (SAP), connected with those of other sense amplifiers. That is, the SAN and SAP nodes of the first bit line pair (BL1 and BLB1) are connected with SAN and SAP nodes of the second bit line pair (BL2 and BLB2) and the 256$^{th}$ bit line pair (BL256 and BLB256) as shown in FIG. 1. The source transistors, mpsrc and mnsrc, are generally located per 256 bit line pairs as depicted in FIG. 1. The number of bit line pairs where source transistors are located depends on DRAM design. For example, the source transistors can be placed per four bit line pairs and the nodes, SAN and SAP, are connected with more bit line pairs, such as connecting with 256 bit line pairs.

The operation of the conventional DRAM core is as follows. In precharge state, bit line pairs are precharged to half $V_{DD}$ through equalization transistors, mne1_1, mne1_2 and mne1_3 for the first bit line pair. Voltage $V_{BL}$ is an internal voltage source to provide half $V_{DD}$ voltage to bit line pairs.

In active mode, line PEQ goes low and all equalization transistors are turned off. A word line in the memory block goes to voltage $V_{PP}$ which exceeds voltage $V_{DD}$ and provides a voltage which is at least equal to $V_{DD}$ plus $V_{tn}$, where $V_{tn}$ is the threshold voltage of the cell access transistor, such as transistor mnc1_1 for the one bit line pair. It is assumed that line WL1 goes to voltage $V_{PP}$ in response to the input address. There is a charge-sharing operating between cell (CS1_1) and bit line capacitance (CBL_1). The bit line capacitance is a parasitic capacitance composed of junction and line capacitance. In the following description it is assumed that stored data at the cell is at logic high. After the charge sharing operation, a certain voltage is developed on the bit line, BL1, which is equal to (CS1_1/(CS1_1+CBL_1))×$V_{DD}$/2.

Then, a signal goes to logic high to turn on a drain of NMOS source transistor mnsrc and the signal developed on the bit line is amplified in response to the latching arrangement of NMOS transistors mns1_1 and mns1_2. Later, the other drain of PMOS source transistor mpsrc is turned-on to restore cell data based on the latching arrangement of PMOS transistors mps1_1 and mps1_2. So, the levels of signals SA_BL1 and SA_BLB1 become $V_{DD}$ and $V_{SS}$, respectively, when the sensing operation is completed. Since the NMOS transistor is used to isolate the blocks that share the sense amplifier, the PISO signal goes to a boosted voltage, $V_{PP}$, to avoid a $V_t$ drop by the NMOS transistors, mniso1_1.

Therefore, the logic high data can be transferred to line BL1 without signal degradation and restored once again into the cell. Similarly, the sensing operation is performed for all bit lines that have cells activated by the word line.

After cell data is read out and restored, the word line is shut off. Signals, PSAE and PSAEB return to logic low and high, respectively, to turn off the source transistors of bit line sense amplifier. Then, signal PEQ goes to high to make the levels of bit lines equalized to half $V_{DD}$ ($V_{DD}/2$). This chip then again enters into so-called precharge state.

In precharge state, since the source transistors of bit line sense amplifiers are turned-off, theoretically, there is no current flowing from $V_{DD}$ to $V_{SS}$. However, due to the device characteristics of MOS transistors, leakage current exists and such a leakage current can represent a large portion of total current draw as the device is scaled down as explained above.

Figure 3:
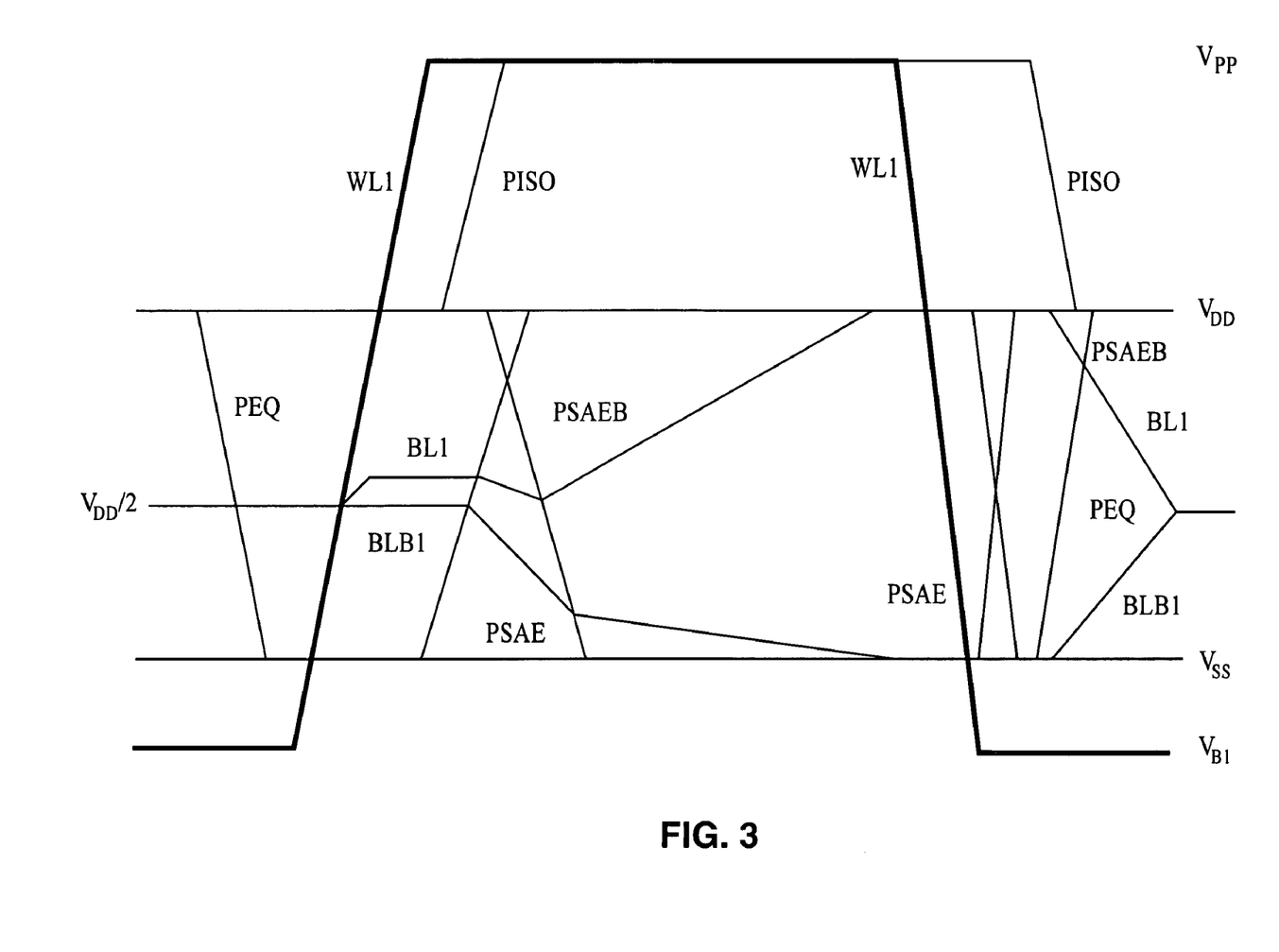
FIG. 3 is a timing diagram for a conventional negative word line scheme.

Another drawback of conventional dynamic memory core circuits involves the delay caused by charge sharing when using high voltage threshold transistors in the data access circuit. This drawback is partially met using a negative word line scheme as depicted in FIG. 3, in which a word line level is set to a voltage lower than voltage $V_{SS}$ when the cell is not accessed.

Additional drawbacks can be found in conventional dynamic memory core circuits which consume unnecessary power or unduly lengthen access times.

Accordingly, a need exists for memory implementations which provide improved speed while suppressing sub-threshold leakage current, and other forms of excess power consumption. The present invention satisfies those needs, as well as others, and overcomes the deficiencies of previously developed memory architectures and sense amplifiers.

BRIEF SUMMARY OF THE INVENTION

The present invention describes circuits and methods for reducing power consumption in dynamic memory devices. These aspects of the invention can be utilized separately or in some cases in combination with one another.

One embodiment of the invention describes a latching scheme within a bit line pair sense amplifier which utilizes transistors configured in a self reversed-biased configuration. The conventional arrangement of an NMOS sense latch (N-latch) coupled to an NMOS drain is replaced with an NMOS sense latch coupled to a PMOS drain which is driven so as to reduce leakage. Similarly, the conventional arrangement of PMOS sense latch (P-latch) coupled to a PMOS drain is replaced with PMOS sense latches and an NMOS drain configured with a method of being driven to reduce leakage. These arrangements of P-latches with N-drains or N-latches with P-drains is referred to herein as a complementary sense transistor arrangement. It should be appreciated that the invention can also be practiced wherein at least one latch is coupled to a complementary drain, while other latches remain coupled to a non-complementary drain. The complementary drains are self reversed-biased in standby modes, and driven in active mode by voltages extending outside the range from $V_{SS}$ to $V_{DD}$, depending on whether an N-drain or P-drain is being driven. The bias condition of the transistors reduces the standby mode leakage current significantly when using the complementary drains according to the invention. This self reversed-biased scheme can be implemented in a number of variations, such as using lumped drains or distributed drains coupled to the sense signal (SAN) and restore signal (SAP) lines.

In another embodiment of the invention a method of driving a conventional sense amplifier is described utilizing an additional supply voltage $V_B$, wherein $V_B<V_{SS}$. This method provides increased reverse bias resulting in suppressed leakage current.

In another embodiment of the invention a new negative word line driver scheme is detailed which utilizes stacked pull-down transistors and preferably a step control of the word line level.

In another embodiment a low power level shifter scheme is described in which a two step discharging process is performed that limits unwanted current flow into the supply voltage referred to as $V_{B2}$.

The present invention is subject to implementation following a number of different embodiments. In summary these can be described according to the following. An embodiment of the present invention can be described as a dynamic memory, comprising: (a) a plurality of storage cells with multiple cell states; (b) a memory core having a bit line structure coupled to the storage cells; (c) a bit line sense amplifier configured for performing sense, or restoration, or both, of the plurality of storage cells; and (d) at least one latch within the sense amplifier coupled to a complementary sense or restore drain transistor. By way of example, the sense amplifier may employ one latch with complementary drain, two latches using complementary drains, one latch with complementary drain and one without, or combinations in which at least one of the latches utilizes a complementary drain.

The bit line sense amplifier is preferably coupled between bit lines in a bit line pair for sharing the charge of said storage cell, or may be alternatively coupled between other nodes. The latch and complementary drain transistor comprises an N-latch coupled to a P-drain, or a P-latch coupled to an N-drain, or both. It will be appreciated that the sense and restore aspects can be implemented separately or in combination. The invention allows the complementary drain transistor to be retained in a reversed biased state during standby mode to reduce leakage current, and activated by boosted voltage levels outside of the range between $V_{SS}$ and $V_{DD}$. The N-latch, or P-latch, or both, are preferably configured as depletion mode transistors or leaky transistors.

The present invention can be embodied as a sense amplifier circuit, comprising: (a) at least one latch coupled between two circuit nodes and configured for sensing or restoring, or both sensing and restoring, the voltages of the nodes; and (b) a complementary drain structure coupled to each latch, or both latches, and configured for self reverse-biasing while in standby mode.

The complementary drain structure is driven by voltage levels outside of the voltage range between $V_{SS}$ and $V_{DD}$. The two circuit nodes preferably comprise a pair of bit lines within a dynamic memory circuit. The latches and complementary drain structures comprise N-latches coupled to a P-drain, or P-latches coupled to an N-drain, or both types of complementary structures.

The present invention can also be embodied as a circuit for driving the word lines within a dynamic memory device, comprising: (a) a signal line configured for coupling within a dynamic memory device to drive memory word selection; (b) a pull-up transistor coupled between the signal line and a control signal PX; and (c) at least two stacked pull-down transistors coupled between the signal line and a voltage source whose voltage is less than VSS. The signal line driving the memory word selection is preferably configured to be activated in two steps, such as to VSS first and then to a voltage level below VSS. The circuit may also comprise a voltage shifting transistor coupled between a word line enable signal and the pull-up transistor; wherein the gate of the voltage shifting transistor is coupled to a voltage source exceeding the supply voltage VDD.

The present invention can also be embodied as a circuit for driving the control signal PX utilized for controlling word line driver state within a dynamic memory device, comprising: (a) a control signal output line (PX) configured for coupling to a word line control circuit within a dynamic memory device for driving memory word selection; (b) means for level conversion of the control signal output line (PX) between a high voltage level $V_{PP}$ and two low voltage levels $V_{SS}$ and $V_{B2}$, wherein $V_{B2}$, $V_{SS}$; (c) wherein said means is configured to prevent a short circuit between $V_{PP}$ and $V_{B2}$.

The present invention can also be embodied as a method of sensing and/or restoring signals between a first and second node, comprising: (a) coupling at least two source transistors of a first transistor type, P-type or N-type, to form a latch between a first and second node being sensed; (b) coupling a complementary drain of a second transistor type, N-type or P-type, between the source transistors of the latch and a sense or restore signal; and (c) retaining the source transistors of the latches in a reversed biased state during standby mode to reduce leakage current. The method further includes driving the transistor of the complementary drain at a voltage level outside of the range between $V_{DD}$ and $V_{SS}$.

It will be appreciated that the teachings of the present invention can be embodied and described in various ways. The present invention also provides a number of beneficial aspects which include but are not limited to the following.

An aspect of the invention is a DRAM architecture which provides lower power dissipation levels.

Another aspect of the invention is a DRAM architecture which provides enhanced data sense speed.

Another aspect of the invention is to provide improved sense amplification within a dynamic random access memory (DRAM).

Another aspect of the invention is to provide a readily implemented mechanism for reducing sub-threshold leakage current.

Another aspect of the invention is to mitigate DRAM speed degradation which arises from scaling down DRAM device geometries.

Another aspect of the invention is a scheme for reducing leakage currents within DRAM structures relying on a folded-bit line structure.

Another aspect of the invention is to provide a sense amplifier circuit utilizing a complementary structure of P-latch with N-drain, or N-latch with P-drain, or both, which are driven accordingly to reduce leakage.

Another aspect of the invention is to provide a method of reducing leakage current within non-complementary sense amplifiers by utilizing a new method of driving.

Another aspect of the invention is to provide a new negative word line driver scheme utilizing a pull-down transistor architecture, such as driven by a two-step word line control mechanism.

Another aspect of the invention is to provide a level shifter scheme which minimizes charge flow into one or more of the power supplies.

A still further aspect of the invention is to provide circuits and methods for increasing sense speed and reducing leakage current that can be readily implemented within DRAM devices and other circuits in accord with current semiconductor processing technologies.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally shown in FIG. 4 through FIG. 11. It will be appreciated that the apparatus may vary as to configuration and as to details of the parts, and that the method may vary as to the specific steps and sequence, without departing from the basic concepts as disclosed herein.

1. Self Reversed-Biased Complementary Sensing Scheme.

Figure 4:
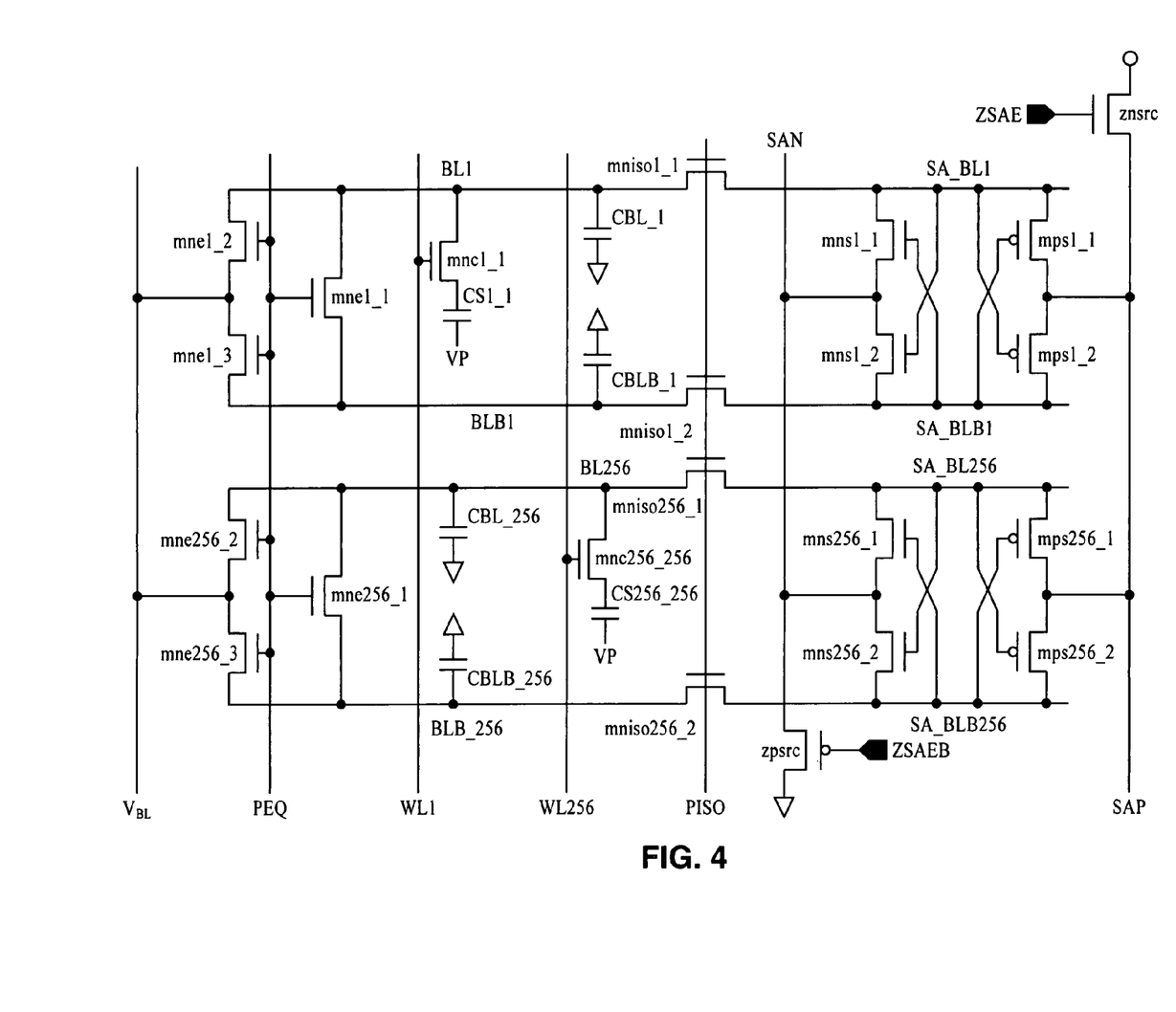
FIG. 4 is a schematic of a DRAM core structure according to an embodiment of the present invention, shown using a latch with complementary drain configuration and gate control method.

FIG. 4 illustrates an example of a new sense amplifier structure to suppress leakage current. This differs from conventional structures in the type of source transistors which are utilized and the mechanisms of driving the sense and restore lines. In the conventional DRAM core of FIG. 1, a drain with PMOS source transistor mpsrc is connected to a source of PMOS transistors mps1_1 and mps1_2, and a drain of NMOS source transistor mnsrc is connected to a source of NMOS transistors mns1_1 and mns1_2. This form of latch-drain combination is referred to herein as a latch with non-complementary drain.

However, in this aspect of the present invention, a drain comprising an NMOS source transistor znsrc is connected to a source of PMOS transistors, such as mps1_1 and mps1_2, and a drain comprising PMOS source transistor zpsrc is connected to a source of NMOS transistors such as mns1_1 and mns1_2. It will be appreciated that the source and drains are referred to as being complementary in this aspect of the invention. The latch and complementary drain are utilized in conjunction with new control mechanisms which make these transistors self reverse-biased in standby mode, wherein leakage current is be suppressed significantly.

Figure 5:
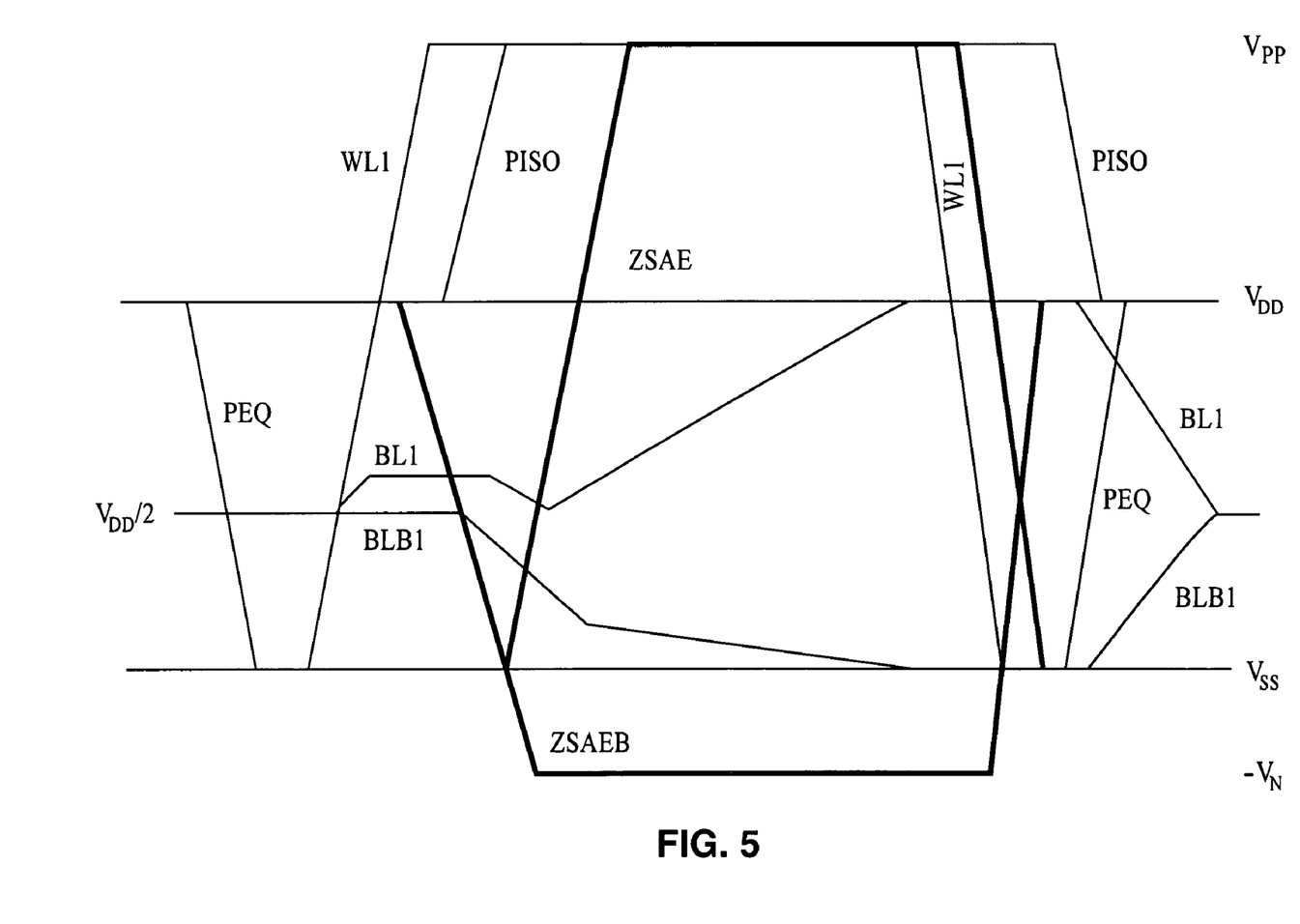
FIG. 5 is a timing diagram for the DRAM core structure of FIG. 4, showing the inclusion of the voltage $V_N<V_{SS}$.

FIG. 5 shows a timing diagram for the control of new sense amplifiers. The sensing procedure of the new structure is almost the same as that of a conventional sense amplifier except signals, ZSAE and ZSAEB. Aspects of the invention for creating the self reverse-biasing are depicted in the timing diagram and the use of an additional source voltage $V_N$ where $V_N<V_{SS}$. In this case, after the charge sharing operation, the signal (ZSAEB) enables a latch comprising NMOS transistors mns1_1 and mns1_2 which goes from voltage $V_{DD}$ to a negative voltage, $V_N$ to turn on the drain comprising PMOS source transistor zpsrc without a $V_t$ drop. For example, if $V_N$ is −1V, operating voltage is 1V and threshold voltage of the PMOS source transistor zpsrc is −0.5V (minus 0.5V), $V_{GS}$ of this source transistor is $V_{GS}=-1V-0.5V=-1.5V$ (the source of PMOS transistor is the SAN signal which is precharged to $V_{DD}/2$ in the precharge state). The drain-gate voltage of this transistor is $V_{GD}=-1V-0V=-1V$ (the drain of PMOS transistor is at voltage $V_{SS}$). Therefore, voltage levels $V_{GS}$ and $V_{GD}$ are much smaller than the threshold voltage of PMOS source transistor and this source transistor is fully turned-on. Thus, the ground potential ($V_{SS}$) can be transferred to SAN, which can be discharged to $V_{SS}$ without a $V_t$ drop.

After the N-latch sense amplifiers comprising NMOS transistors mns1_1 and mns1_2 are activated, the P-latch sense amplifiers comprising PMOS transistors mps1_1 and mps1_2 are also activated to restore cell data as in a conventional sense amplifier. The gate signal (ZSAE) of the drain comprising NMOS source transistor znsrc goes to a boosted voltage $V_{PP}$ to avoid a $V_t$ drop in transferring a full $V_{DD}$ level to line SAP. If a boosted voltage is 2V and the $V_t$ of NMOS source transistor is 0.5V, $V_{GD}$ (drain is power line, $V_{DD}$) of NMOS source transistor is $V_{GD}=2V-1V=1V$ and $V_{GS}=2V-0.5V=1.5V$ (SAP is $V_{DD}/2$ in precharge state). Thresholds $V_{GD}$ and VGS exceed the voltage $V_t$, therefore, this source transistor is fully turned on and a full $V_{DD}$ can be transferred to SAP without $V_t$ drop.

The bias condition of these source transistors in precharge state can suppress leakage significantly. In conventional core structures, such as shown in FIG. 1, voltage $V_{GS}$ of the drains comprising source transistors mpsrc and mnsrc is zero. However, in the new structure, the control signals, ZSAEB and ZSAE go to $V_{DD}$ and $V_{SS}$, respectively, in precharge state. The gate-source voltage $V_{GS}$ of the PMOS source transistor in precharge state is $V_{GS}=V_{DD}1/2V_{DD}=1V-0.5V=0.5V$ (ZSAEB goes to high, $V_{DD}$ and SAN is precharged to $1/2V_{DD}$). Drain-gate voltage $V_{GD}=1V-0V=1V$ (ZSAEB goes to high, $V_{DD}$ and drain is $V_{SS}$). Therefore, voltages $V_{GS}$ and $V_{GD}$ are positive values, for example voltage $V_{GS}$ and $V_{GD}$ are reverse-biased (the gate potential should be lower than source and drain potentials by more than $V_t$ of PMOS transistor in order to turn on PMOS transistor) and leakage current is significantly reduced. Voltage $V_{GS}$ of the NMOS source transistor, znsrc, is $V_{GS}=0V-0.5V=-0.5V$ (reverse biased) and $V_{GD}=0V-1V=-1V$, respectively. Therefore, the NMOS source transistors are fully turned off and leakage current can be suppressed significantly while in standby mode. It should be noted that this aspect of the present invention teaches the type, configuration and methods of controlling these source transistors.

It should be appreciated that these source transistors can be shared by multiple bit lines as illustrated in FIG. 4. In this case a lumped source configuration is provided in which the source transistor is shared by 256 bit line pairs with the source transistors shared by 2, 4, 8, and so forth.

Device leakage current can be reduced utilizing the complementary drain scheme to about one-tenth of original leakage current for reverse $G_{VS}$ biasing by 80 mV, so leakage current by this new method can be reduced by at least four orders of magnitude. Therefore, for 1 GB cells, leakage current can be reduced to 0.2 µA from 2 mA.

Figure 6:
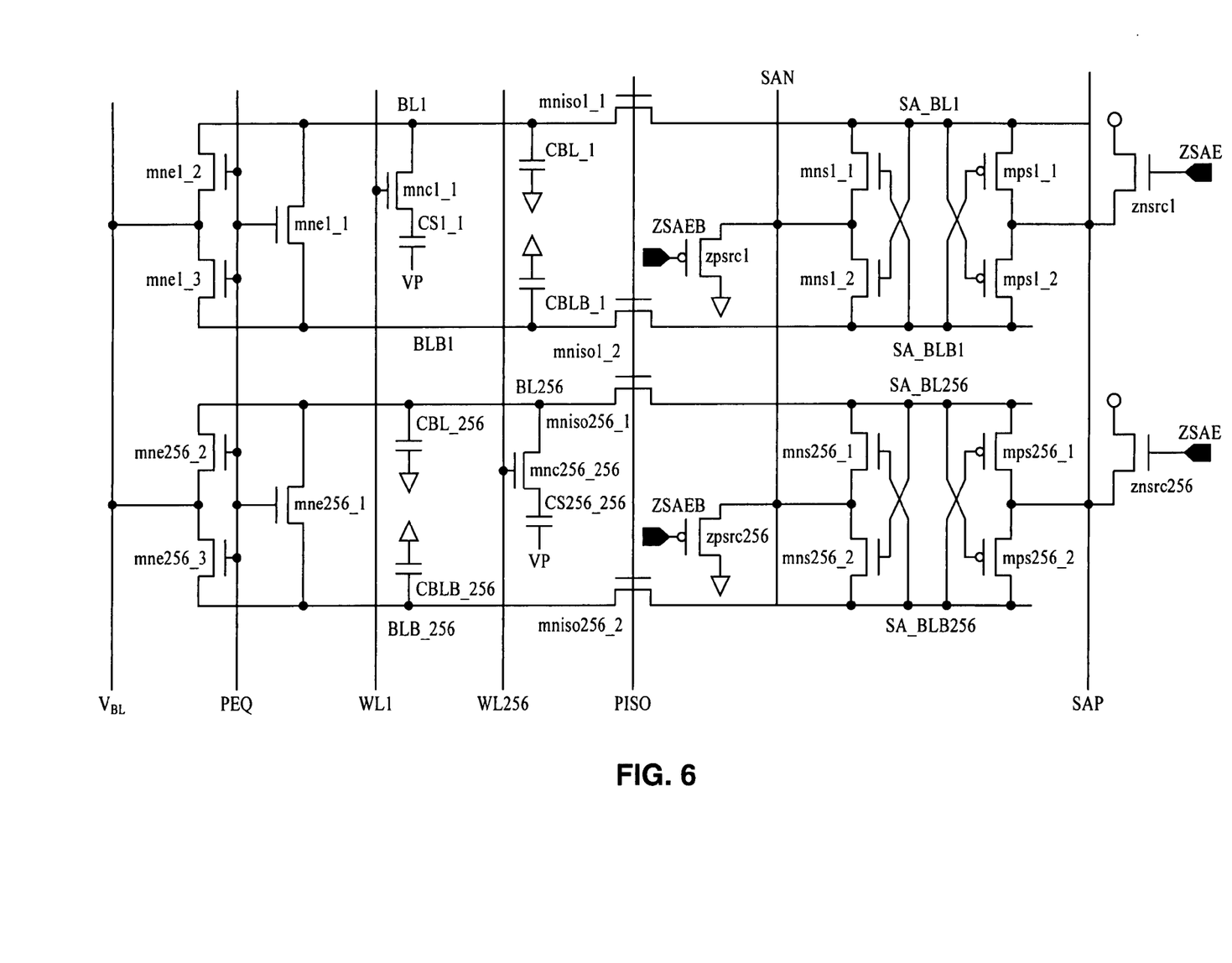
FIG. 6 is a schematic of a DRAM core structure according to an embodiment of the present invention, shown having distributed sense and restore transistors.

FIG. 6 depicts an alternative configuration in which each bit line pair can provide its own source transistors, which is referred to as a distributed source configuration.

2. Reversed Biasing a Non-Complementary Sensing Scheme.

Figure 7:
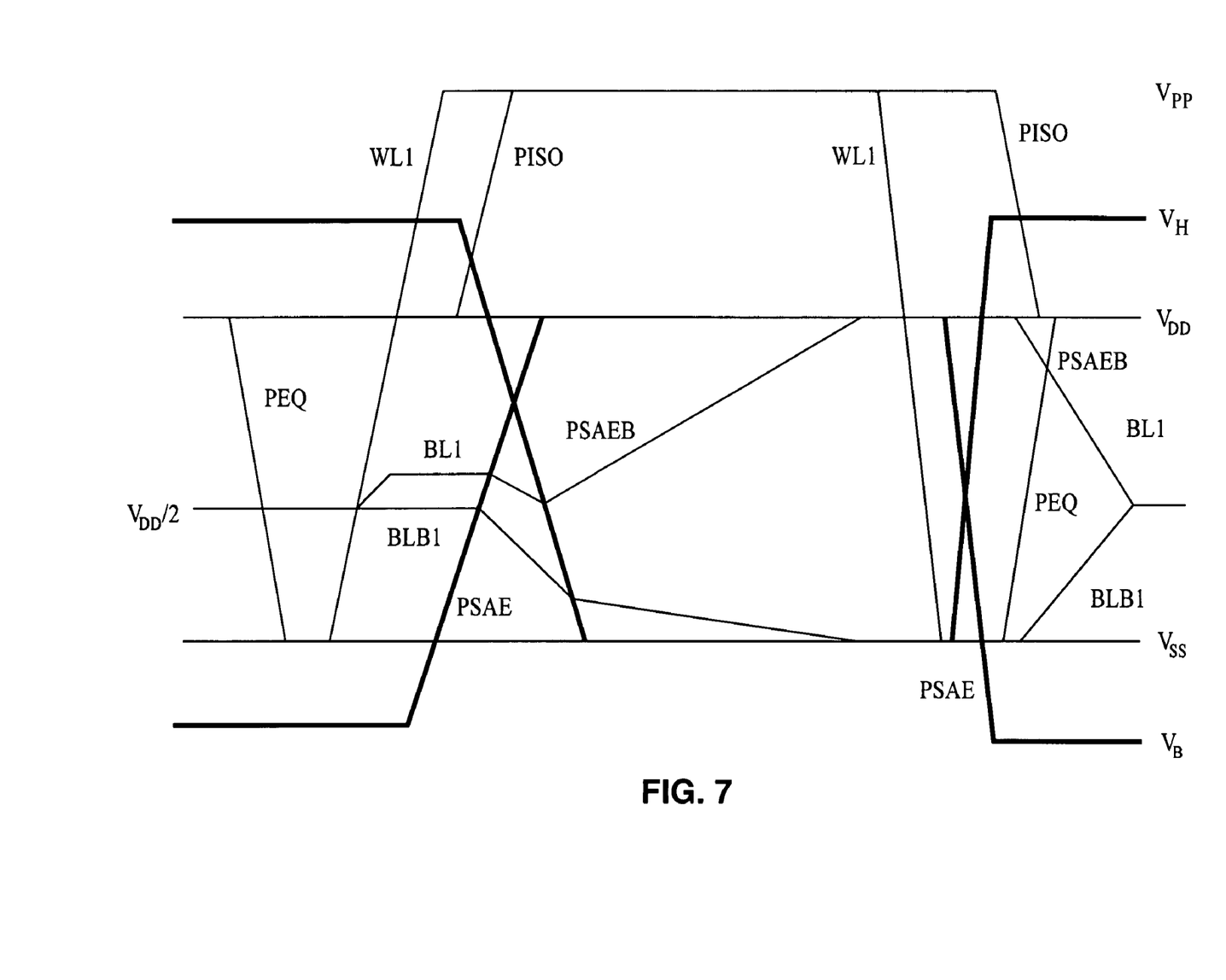
FIG. 7 is a timing diagram for a reverse biasing method according to an aspect of the present invention.

FIG. 7 illustrates an example waveform in which leakage current for a conventional, non-complementary, sense amplifier, as depicted in FIG. 1 and FIG. 2, can be significantly reduced. In a conventional sense amplifier scheme, lines PSAE and PSAEB go to logic low and high in standby mode (see FIG. 2).

However, according to this aspect of the present invention, lines PSAE and PSAEB are retained at a lower voltage than $V_{SS}$, such as $V_B$, and a higher voltage than $V_{DD}$, such as $V_H$, during standby mode as illustrated by FIG. 6. Therefore, $V_{GS}$ of PMOS and NMOS source transistors mpsrc and mnsrc is reverse biased. For example, in standby mode, if a boosted voltage is 1.5V and $V_{DD}$ is 1V, then voltage VGS of the PMOS source transistor is $V_{GS}=1.5V-1V=0.5V$. Therefore, the source transistor is reverse-biased by 0.5V. In standby mode, if a lower voltage is −0.5V and $V_{SS}$ is 0V, VGS of the NMOS source transistor is $0V-0.5V=-0.5V$. Therefore, the NMOS source transistor is reverse-biased by 0.5V. With this control method, source transistors can be reverse-biased and leakage current can be suppressed significantly. In active mode, lines PSAE and PSAEB can go to a higher voltage and a lower voltage as well.

It should be recognized that one or more latches coupled to non-complementary drains and being driven as described above may be combined according to the invention with one or more latches coupled to complementary drains being similarly driven.

3. Negative Word Line Driver Scheme.

Another aspect of the invention is a description of a new negative word line scheme. It will be appreciated that to maintain the DRAM cell data, the threshold voltage of the access transistor (mnc1_1) is much higher than that of peripheral transistors. However, when the threshold of the cell access transistor is high, a much higher voltage is required to transfer charge from the cell to the bit line and charge the bit line to the cell, and longer time is taken to complete the charge sharing and restoring operation. A partial solution was depicted with regard to FIG. 3, discussed in the background of the invention, in which a word line level is set lower than voltage $V_{SS}$ when the cell is not accessed.

Figure 8:
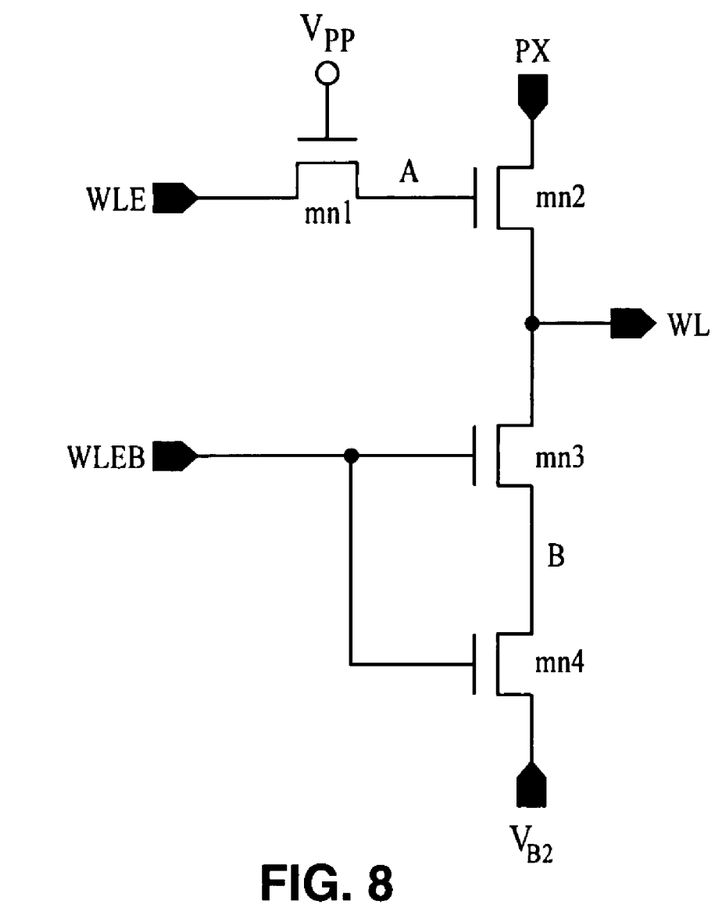
FIG. 8 is a schematic of a DRAM negative word line driver scheme according to an aspect of the present invention.
Figure 9:
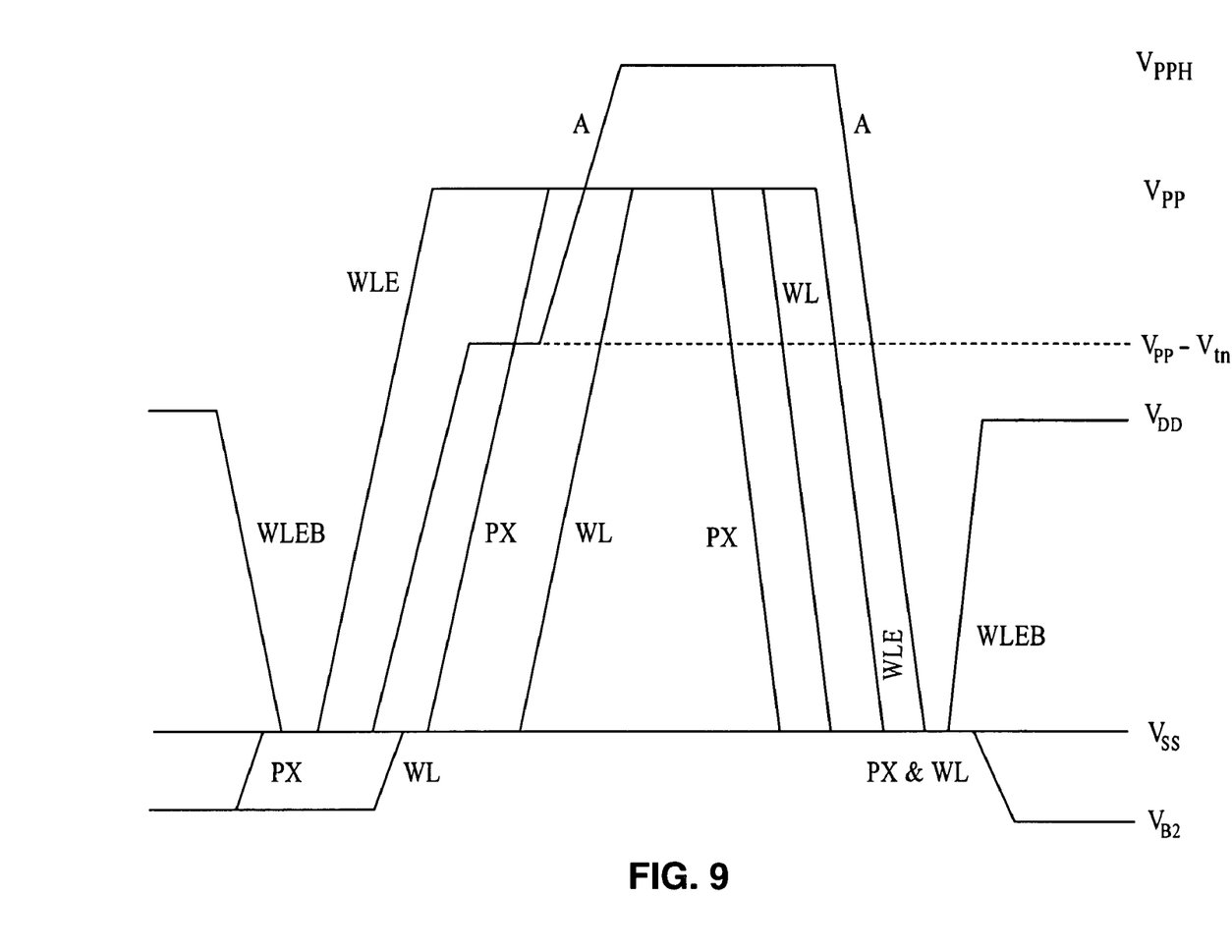
FIG. 9 is a timing diagram for the negative word line scheme shown in FIG. 8.

FIG. 8 and FIG. 9 illustrate a new negative word line driver scheme which provides a number of advantages. A feature of this aspect of the invention is the use of stacked pull-down transistors mn3 and mn4 of FIG. 8 to increase the effective threshold voltage of pull-down transistors due to increased source-to-bulk potential ($V_{SB}$).

FIG. 9 shows a timing diagram of the new negative word line scheme in FIG. 8. In stand-by mode, lines WL and PX have a negative bias level ($V_{B2}$) to turn off the cell access transistors more strongly. It should be appreciated that signal PX is an on-chip boosted signal and WL is a decoded boosted signal by address. WLEB is logic high and transistors mn3 and mn4 are turned on and lines WL and PX are at voltage $V_{B2}$. The node A voltage is $V_{SS}$ since line WLE is low. When the word line (WL) is to be enabled according to the address, PX goes to voltage $V_{SS}$. When WLE goes to $V_{PP}$ and node A goes to $V_{PP}-V_{tn}$, where $V_{tn}$ is the threshold voltage of transistor mn1, then transistor mn2 is turned on. When transistor mn2 is turned on, the WL goes to voltage $V_{SS}$ since line PX is now at $V_{SS}$. When line PX goes to voltage $V_{PP}$, the node A level is bootstrapped to voltage $V_{PPH}$ which is higher than voltage $V_{PP}$ and the PX level is transferred to WL without a $V_t$ drop. When the word line is discharged, line PX goes to voltage $V_{SS}$ and WL goes to $V_{SS}$ since the node A level is $V_{PPH}$. When WLE goes to voltage $V_{SS}$, the node A level goes to $V_{SS}$ and transistor mn2 is turned off. Then, WLEB goes to $V_{DD}$ and transistors mn3 and mn4 are turned on and WL goes to a negative voltage level $V_{B2}$. The PX signal goes to $V_{B2}$ to prevent a current flowing from PX ($V_{SS}$) to $V_{B2}$ since transistor mn2 is turned on as WL goes to voltage $V_{B2}$.

Another feature of this aspect of the invention is utilizing of the two-step control of the word line level to eliminate a direct (short) path from $V_{PP}$ to $V_{B2}$. This is accomplished by having the separate controls WLE and WLEB for controlling the transistors coupled between $V_{PP}$ to $V_{B2}$. Voltage $V_{B2}$ is created by an on-chip voltage generator and has a certain amount of capability to extract flowing charge from other sources. The more charge is flowing into $V_{B2}$, the faster operation to maintain the $V_{B2}$ level is needed and it results in extra power consumption, especially within specific operating modes such as the self-refresh mode.

Another aspect of the invention is to utilize higher threshold ($V_t$) transistors for stacked pull-down transistors, such as shown in FIG. 8, than are utilized for the other transistors in a word line driver scheme.

Another aspect of the invention involves not requiring a word line disable signal (WLEB) to reach a negative potential state in standby mode, therein reducing the amount of charge flowing into $V_{B2}$.

4. Low Power Level Shifter Scheme.

Figure 10:
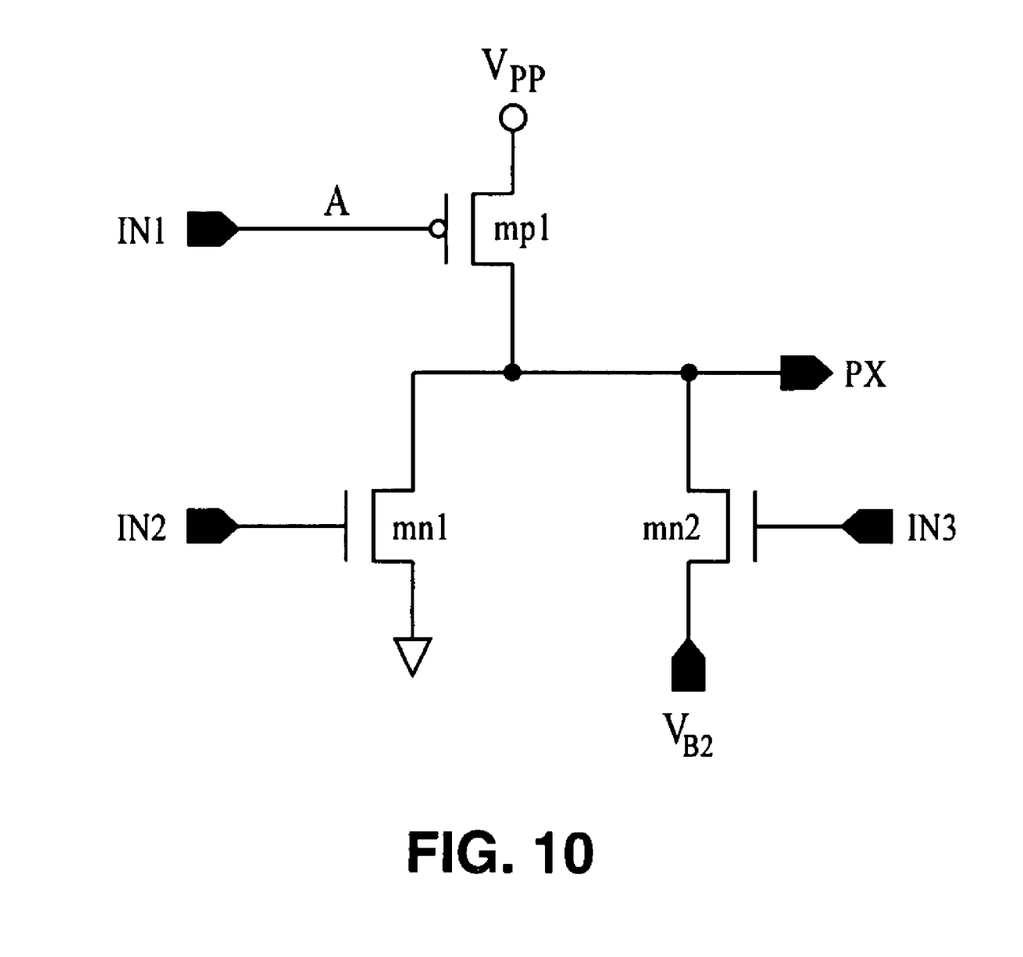
FIG. 10 is a schematic of a PX driver structure according to an aspect of the present invention.
Figure 11:
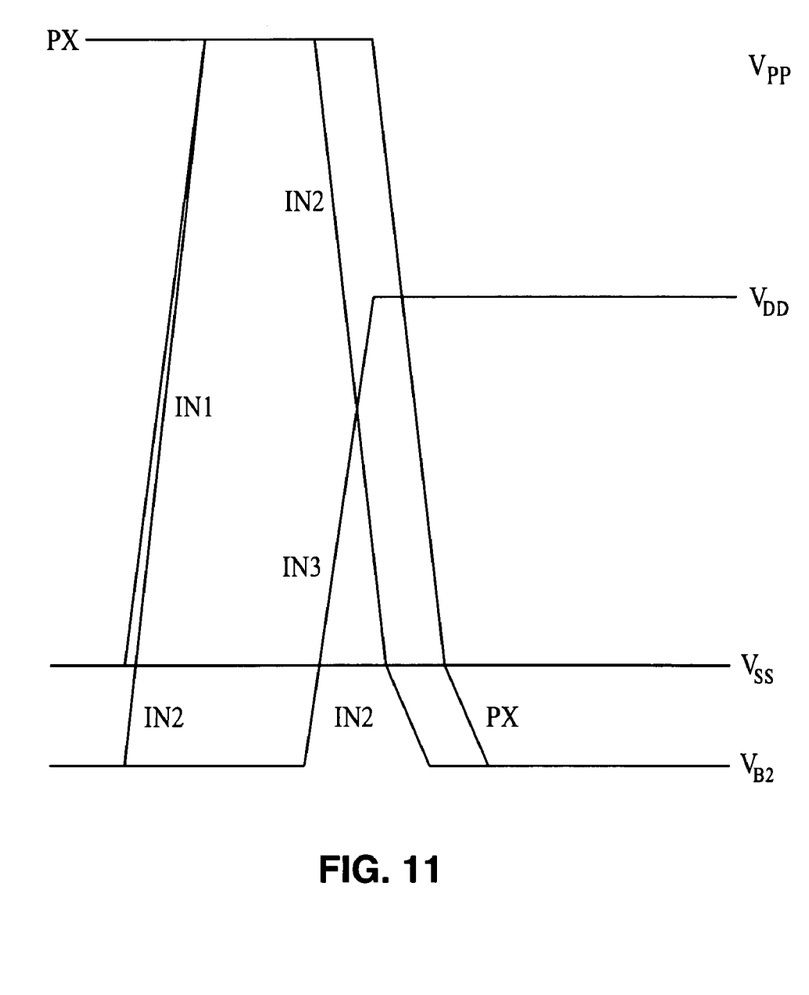
FIG. 11 is a timing diagram for the PX driver structure of FIG. 10.

FIG. 10 and FIG. 11 illustrate byway of example a low power level shifter method for minimizing charge dissipation. As explained above, minimizing charge dissipation to $V_{B2}$ is important in a negative word line scheme. This is accomplished according to this aspect of the invention utilizing a two-step discharging process. The control signal driver, such as PX driver, is preferably configured to have a capability to discharge to $V_{SS}$ first and then $V_{B2}$ later to minimize charge flowing into $V_{B2}$. FIG. 10 illustrates a PX driver implementation and FIG. 11 an associated timing diagram. To discharge the PX node, IN1 and IN2 goes to voltage $V_{PP}$ and line PX goes down to voltage $V_{SS}$ through transistor mn1. Then, IN3 goes to voltage $V_{DD}$ (or $V_{PP}$) and IN2 goes to voltage $V_{B2}$ to turn off transistor mn1 completely. Since transistor mn2 is turned on and the PX node is discharged to voltage $V_{B2}$ without unwanted current flowing into $V_{B2}$. The timing of these signals is readily seen in FIG. 11.

5. Summary.

The present invention describes a number of circuits and methods for reducing power consumption which are particularly well suited for use within dynamic random access memory (DRAM) devices. Circuits and method are also described for decreasing data access times within DRAM devices. It should be appreciated, however, that the circuits described herein can be utilized in a variety of low voltage control circuits without departing from the teachings of the present invention.

Numerous schematics and waveforms are depicted by way of example for implementing these aspects of the invention. It should be readily appreciated that the teachings of the present invention can be applied to numerous circuits by one of ordinary skill in the art without departing from the present invention.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A circuit for driving the word lines within a dynamic memory device, comprising:

a signal line configured for coupling within a dynamic memory device to drive memory word selection;

a pull-up transistor coupled between said signal line and a control signal PX; and at least two stacked pull-down transistors coupled between said signal line and a voltage source whose voltage is less than $V_{SS}$.

2. A circuit as recited in claim 1, further comprising a voltage shifting transistor coupled between a word line enable signal and said pull-up transistor; wherein the gate of said voltage shifting transistor is coupled to a voltage source exceeding the supply voltage $V_{DD}$.

3. A circuit as recited in claim 1, wherein a first word line enable signal is coupled to the gate of said pull-up transistor, and a second word line enable signal is coupled to the gates of said stacked pull-down transistors.

4. A circuit as recited in claim 1, wherein said signal line comprises a word line within said dynamic memory device.

5. A circuit as recited in claim 1, wherein said control signal PX is configured to generate selectable voltage levels to which said signal line is pulled up.

6. A circuit as recited in claim 1, wherein said pull-up transistor is configured to pull-up said signal line toward said control signal output line (PX) in response to being activated by a word line enable signal.

7. A circuit for driving the control signal PX utilized for controlling word line driver state within a dynamic memory device, comprising:

a word line control circuit within a dynamic memory device for driving a word line during memory word selection;
a control signal output line (PX) coupled to said word line control circuit to supply a pull-up voltage; and
means for level conversion of the control signal output line (PX) between a high voltage level $V_{PP}$ and two low voltage levels $V_{SS}$ and $V_{B2}$, wherein $V_{B2} < V_{SS}$.

8. A circuit as recited in claim 7, wherein said means of level conversion comprises:
a pair of parallel pull-down transistors coupled between said control signal output line (PX);
wherein a first parallel pull-down transistor is coupled to a first voltage $V_{SS}$ and receives a signal IN2 upon its gate;
wherein a second parallel pull-down transistor is coupled to a second voltage $V_{B2}$, wherein $V_{B2}$ is less than $V_{SS}$, and receives a signal IN3 upon its gate;
a pull-up transistor coupled between said control voltage signal output line (PX) and a high voltage level in excess of voltage $V_{DD}$;
wherein the gate of said pull-up transistor is coupled to a control signal IN1; and
means of sequencing the voltages on control signals IN1, IN2 and IN3 to discharge said control output line (PX) without excess current flow into voltage source $V_{B2}$.

9. A circuit as recited in claim 8, wherein said means of sequencing the voltage IN1, IN2 and IN3 is configured for driving IN1 and IN2 to $V_{PP}$ causing control signal (PX) to drop to $V_{SS}$, and then setting IN3 to $V_{DD}$ or $V_{PP}$ and IN2 to $V_{B2}$.

10. A circuit as recited in claim 7, wherein said means is configured to prevent a short circuit between $V_{PP}$ and $V_{B2}$.

11. A circuit as recited in claim 7, wherein the word line control circuit is configured to pull-up said word line toward said control signal output line (PX) in response to being activated by a word line enable signal.

12. A circuit as recited in claim 7, wherein said word line control circuit comprises at least one transistor connected between said word line and said control signal output line (PX).

13. A circuit as recited in claim 12, wherein said at least one transistor of said word line control circuit is configured for supplying said control signal output line (PX) to said word line in response to receiving a word line enable signal.

14. A circuit for driving the voltage level of a word line within a dynamic memory device, comprising:
a word line control circuit within a dynamic memory device, said word line control circuit configured to pull-up a word line for driving a word line during memory word selection;
a control signal output line (PX) configured as a selectable voltage toward which said word line control circuit pulls up said word line; and
a level conversion circuit for generating a voltage on said control signal output line (PX) between a high voltage level $V_{PP}$ and two low voltage levels $V_{SS}$ and $V_{B2}$.

15. A circuit as recited in claim 14, wherein said level conversion circuit is configured to prevent a short circuit between $V_{PP}$ and $V_{B2}$.

16. A circuit as recited in claim 15, wherein said word line control circuit is configured to pull-up said word line toward said control signal output line (PX) in response to being activated by a word line enable signal.

17. A circuit as recited in claim 15, wherein said word line control circuit comprises at least one transistor connected to said word line and to control signal output line (PX).

18. A circuit as recited in claim 17, wherein said at least one transistor of said word line control circuit is configured for supplying control signal output line (PX) to said word line in response to receiving a word line enable signal.

19. A circuit as recited in claim 14, wherein said word line control circuit is further configured to pull-down said word line in two voltage level steps.

20. A circuit for driving the word lines within a dynamic memory device, comprising:
a signal line configured for coupling within a dynamic memory device to drive memory word selection;
a pull-up transistor coupled between said signal line and a control signal PX;
at least two stacked pull-down transistors coupled between said signal line and a voltage source whose voltage is less than $V_{ss}$; and
a voltage shifting transistor coupled between a word line enable signal and said pull-up transistor; wherein the gate of said voltage shifting transistor is coupled to a voltage source exceeding the supply voltage $V_{DD}$.

21. A circuit as recited in claim 20, wherein said signal line driving said memory word selection is configured to be activated intwo steps, Vphd ss first and then to a voltage level below $V_{ss}$.

22. A circuit as recited in claim 20, wherein a first word line enable signal is coupled to the gate of said pull-up transistor, and a second word line enable signal is coupled to the gates of said stacked pull-down transistors.

23. A circuit as recited in claim 20, wherein siad signal line comprises a word line within said dynamic memory device.

24. A circuit as recited in claim 20, wherein said control signal PX is configured to generate selectable voltage levels to which said signal line is pulled up.

25. A circuit as recited in claim 20, wherein said pull-up transistor is configured to pull-up said signal line toward said control signal output line (PX) in response to being activated by a word line enable signal.

* * * * *